US009331158B2

(12) United States Patent
Scuderi

(10) Patent No.: US 9,331,158 B2
(45) Date of Patent: May 3, 2016

(54) TRANSISTOR DEVICES AND METHODS

(71) Applicant: QUALCOMM Incorporated, San Diego, CA (US)

(72) Inventor: Antonino Scuderi, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 14/486,969

(22) Filed: Sep. 15, 2014

(65) Prior Publication Data

US 2016/0079378 A1 Mar. 17, 2016

(51) Int. Cl.
*H01L 29/417* (2006.01)
*H01L 29/78* (2006.01)
*H03K 17/16* (2006.01)

(52) U.S. Cl.
CPC ...... *H01L 29/41775* (2013.01); *H01L 29/7816* (2013.01); *H03K 17/162* (2013.01)

(58) Field of Classification Search
CPC .................... H01L 29/41725; H01L 29/41758
USPC .................................. 257/401, 355; 327/534
See application file for complete search history.

(56) References Cited

U.S. PATENT DOCUMENTS

| 6,164,781 | A | 12/2000 | Tsang et al. |
| 7,358,564 | B2 | 4/2008 | Hokomoto et al. |
| 7,498,872 | B2 | 3/2009 | Nishimoto et al. |
| 8,222,694 | B2 | 7/2012 | Hebert |
| 8,592,919 | B2 | 11/2013 | Inoue |
| 2005/0127440 | A1 | 6/2005 | Yasuhara et al. |
| 2010/0117162 | A1 | 5/2010 | Roehrer et al. |

FOREIGN PATENT DOCUMENTS

| JP | H0766397 A | 3/1995 |
| JP | 2006278677 A | 10/2006 |

OTHER PUBLICATIONS

International Search Report and Written Opinion—PCT/US2015/047043—ISA/EPO—Nov. 9, 2015.

*Primary Examiner* — Cuong Q Nguyen
*Assistant Examiner* — Tong-Ho Kim
(74) *Attorney, Agent, or Firm* — Fountainhead Law Group P.C.

(57) ABSTRACT

The present disclosure includes transistor devices and methods. In one embodiment, a transistor includes a gate, a source, and a drain. According to one aspect of the disclosure, different resistive paths in the drain are compensated using different gate-to-drain capacitances. According to another aspect of the disclosure, current enters a drain at a center tap point and flows symmetrically outward under two adjacent gates to two adjacent sources.

20 Claims, 4 Drawing Sheets

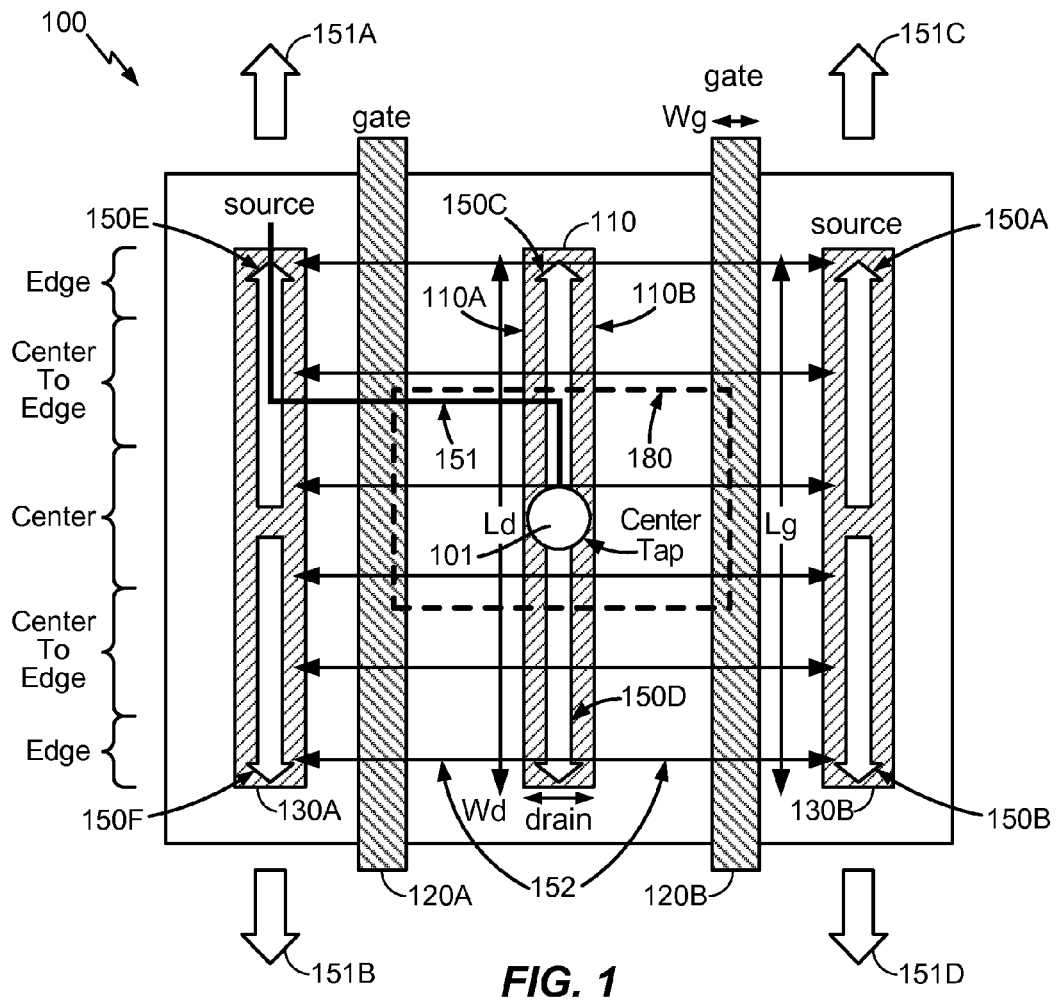
FIG. 1
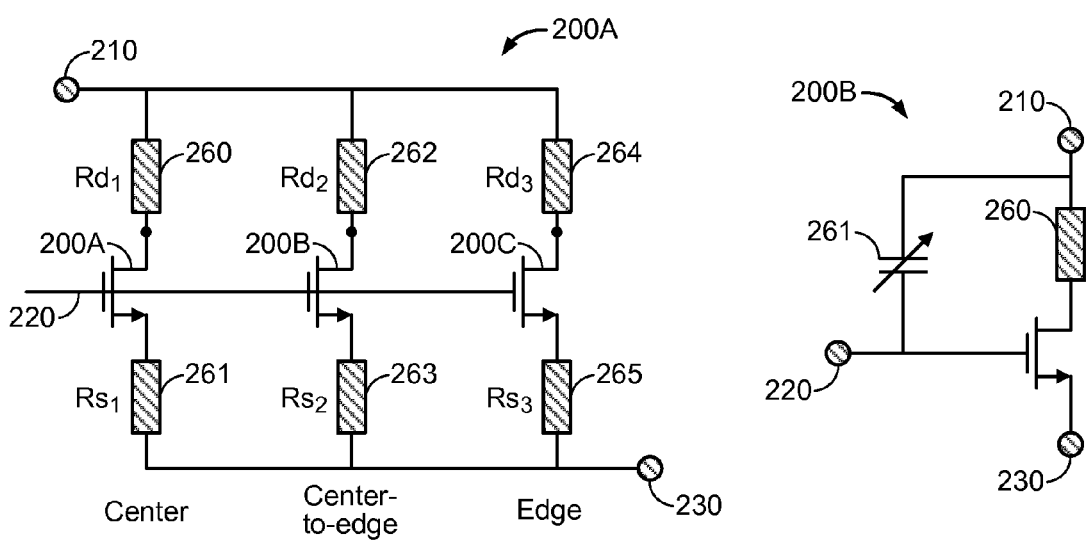
FIG. 2A
FIG. 2B

TRANSISTOR DEVICES AND METHODS

BACKGROUND

The present disclosure relates to semiconductor devices and methods, and in particular, to transistor devices and methods.

Performance demands on electronic circuits continue to escalate. A basic building block of nearly all electronic circuits is the transistor. As transistors are operated at even increasing speeds, parasitic effects inside the devices become increasing problematic. For example, as current flow through terminals of a transistor device, internal resistances may cause voltage drops that can dissipate power and reduce the efficiency of the circuit. Such internal resistance can place limits on the size of devices used in particular applications due to the voltage drop. Many applications require transistors that can deliver large amounts of current at very high speeds. At the same time, in order to manage high power levels, the transistors must be able to manage high voltages. Existing solutions for reducing these parasitic effects and for managing high current and high voltage are not optimal for meeting the increasing demands of the electronics industry.

SUMMARY

The present disclosure includes transistor devices and methods. In one embodiment, a transistor includes a gate, a source, and a drain. According to one aspect of the disclosure, delays caused by different resistive paths in the drain are compensated using different gate-to-drain capacitances. According to another aspect of the disclosure, current enters a drain finger at a center tap point and flows symmetrically outward under two adjacent gates to two adjacent sources.

The following detailed description and accompanying drawings provide a better understanding of the nature and advantages of the present disclosure.

BRIEF DESCRIPTION OF THE DRAWINGS

FIG. 1 illustrates transistor according to one embodiment.

FIG. 2A illustrates a model of parasitic resistance in a transistor according to one embodiment.

FIG. 2B illustrates a compensation technique for parasitic resistance according to one embodiment.

DETAILED DESCRIPTION

Figure 3:
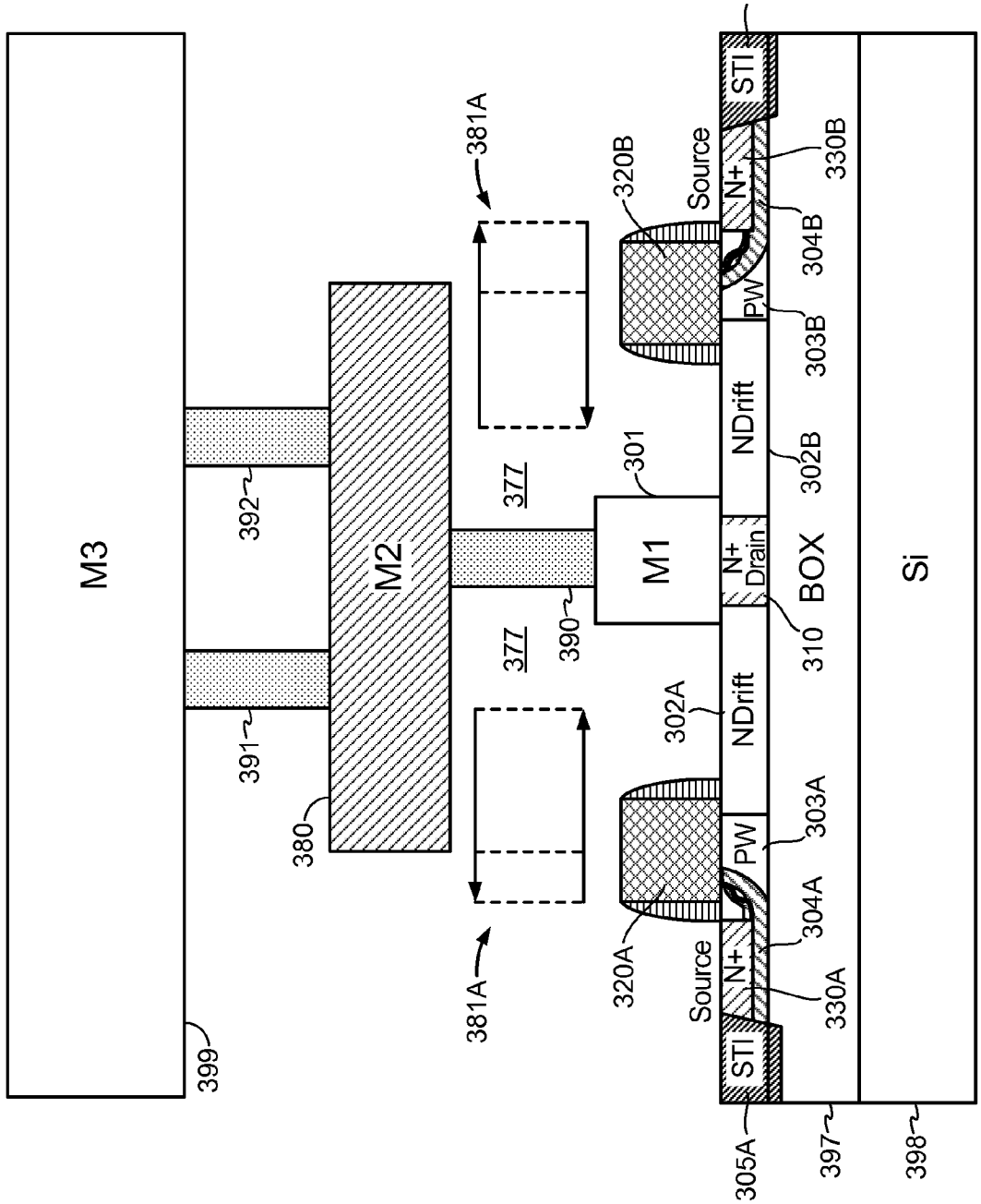
FIG. 3 illustrates an example transistor with backend compensation according to one embodiment.

The present disclosure pertains to transistor devices and methods. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

FIG. 1 illustrates an example transistor 100 according to one embodiment. In this example, transistor 100 is a metal oxide semiconductor field effect transistor (MOSFET). Transistor 100 includes a drain 110, a gate 120A-B, and a source 130A-B. In this example, the source and gate comprise two structures 120A and 120B on opposite sides 110A and 110B of drain 110. In particular, drain 110 comprises a length Ld and a width Wd. The source comprises a first source finger 130A arranged in parallel with the length, Ld, of the drain 110 on a first side 110A of drain 110 and a second source finger 130B arranged in parallel with the length of drain 110 on a second side 110B of drain 110. The gate of transistor 100 comprises a first gate finger 120A arranged in parallel with the length of drain 110 between the first side 110A of the drain and the first source finger 130A and a second gate finger 120B arranged in parallel with the length of the drain 110 between the second side 110B of the drain and the second source finger 130B.

Features and advantages of the present disclosure include a center tap 101 on drain 110. A conductive material 180 (dashed line) may be arranged vertically above drain 110 and in electrical contact with the drain at the center tap 101 located at a midpoint (e.g., Ld/2) of the length, Ld, of drain 110, for example. Conductive material 180 may be a backend (BE) metal layer, for example. Accordingly, current may flow to drain 101 from BE 180 along current paths 150A-F. As current flows along each path, the current encounters a parasitic resistance in the drain and/or source. Accordingly, paths 150A-F are also referred to herein as resistive paths.

In this example, current flows into drain 110 at center tap 101, across a channel 152 under gates 120A-B, and out both ends of source 130A along paths 150E and 150F and out both ends of source 130B along paths 150A and 150B. For current 151A flowing out of a first end of source 130A, the current may traverse a variety of paths along half of drain 110, across the channel under gate 120A, and along half of source 130A. For example, current may flow into center tap 101 and directly from drain 110 to source 130A. In this case, current may experience a resistive path including a negligible drain resistance (from the center tap to the channel region) and a large source resistance along half the length of the source. Alternatively, current may flow into center tap 101, along a portion of drain 110, across the channel to source 130A, and along a portion of source 130A. In this case, current may experience a resistive path including a larger drain resistance (from the center tap to a point between the center and end of the drain) and a lower source resistance along less than half the length of the source. This path is illustrated at 151, for example. Similarly, current may flow into center tap 101 to an end of drain 110, across the channel to an end of source 130A. In this case, current may experience a resistive path including the largest drain resistance (from the center tap to the end of the drain) and the smallest source resistance (out the end of the source), which may be negligible.

Of course, a continuum of such current and resistive paths may exist as current flows into center tap 101, along various sections of the drain, across the channel, and along various lengths of the source. For example, current 151B may likewise flow into center tap 101, toward the other end of drain 110 along current and resistive path 150D, across the channel to source 130A, and along current and resistive path 150F. Similarly, current 151C may flow into center tap 101, toward the end of drain 110 along current and resistive path 150C, across the channel to source 130B, and along current and resistive path 150A. Finally, current 151D may flow into center tap 101, toward the end of drain 110 along current and resistive path 150D, across the channel to source 130B, and along current and resistive path 150B.

FIG. 2A illustrates a model of parasitic resistance in a transistor according to one embodiment. In this example, transistor 100 of FIG. 1 is modeled as a circuit. From the above description it can be seen that transistor 100 may be divided into three parallel transistors with different resistive/current paths along a center region, center to edge region, and edge region. A center region of transistor 100 may be modeled as a first transistor 200A having a drain resistance (Rd1) 260 and source resistance (Rs1) 261. A center to edge region may be modeled as a second transistor 200B having a drain resistance (Rd2) 262 and source resistance (Rs2) 263. An edge region may be modeled as a third transistor 200C having a drain resistance (Rd3) 264 and source resistance (Rs3) 265, for example. Each transistor 200A-C has a common gate 220, drain 210, and source 220, for example. It is to be understood that transistor 100 may be modeled using fewer or additional parallel transistors, for example.

The parasitic resistances along each resistive path may be different. As mentioned above, for a center region, transistor 200A may have a small drain resistance and a large source resistance. For a center-to-edge region, transistor 200B may have a similar sized drain resistance and source resistance. For an edge region, transistor 200A may have a large drain resistance and a small source resistance. One example advantage of a center tap 101 in the example shown in FIG. 1 is that the current and resistive paths are symmetric across four quadrants of the device, thereby producing balanced drain-to-source resistive paths. Accordingly, both paths for top and bottom end regions for drain 110, gate 120A-B, and sources 130A-B may be combined into a single model, paths for top and bottom center-to-end regions for drain 110, gate 120A-B, and sources 130A-B may be combined into a single model, and paths for top and bottom center regions for drain 110, gate 120A-B, and sources 130A-B may be combined into a single model.

FIG. 2B illustrates a compensation technique according to one embodiment. Another aspect of the present disclosure pertains to compensating delay caused by parasitic resistance in a transistor. For example, FIG. 2 illustrates a circuit 200B to compensate for different delays along the parasitic drain resistive paths of transistor 200 according to one embodiment. In this example, a capacitance 261 is provided between the gate 220 and drain 210 to form an RC circuit with drain resistance 260. Embodiments of the present disclosure include a capacitance that varies across a length of the drain to compensate for corresponding variations between different resistive paths along the drain, for example. In some embodiments, a conductive material (e.g., backend metal 180 in FIG. 1) may produce a gate to drain capacitance. As described in more detail below, the conductive material may be varied across the length of the drain to produce different gate-to-drain capacitances that compensate for different drain resistances along the length of the drain.

FIG. 3 illustrates an example transistor with backend compensation according to one embodiment. In this example, a transistor is formed on a silicon-on-insulator substrate including a silicon substrate 398 and buried oxide (BOX) 397. The transistor includes a heavily doped n+ drain 310, gates 320A-B and heavily doped n+ sources 330A-B. The transistor device may include a shallow trench isolation (STI) 305A-B, Ndrift regions 302A-B, depletion regions 304A-B, and p-type well (PW) region 303A-B. In this example, a metallization layer (M1) 301 forms a center tap connection to drain 310. M1 is coupled to another metallization layer (M2) 380 through a via 390. Likewise, M2 is coupled to a third metallization layer (M3) 399 through vias 391 and 392.

Embodiments of the present disclosure may vary the width of a backend layer (e.g., M2) to change the gate-to-drain capacitance at different points along the length of a drain. As illustrated in FIG. 3, M2 380 is electrically connected to drain 310. M2 is also in proximity to gate 320A-B with a non-conductive material 377 between M2 and the gate. The proximity of the gate and M2 produces a gate-to-drain capacitance, Cgd, for example. As illustrated at 381A-B, the position of each end of M2 may be different at different points along the drain so that different points of the drain have different values for Cgd. In one embodiment, the width of M2 is modified so that both gates have the same Cgd at the same point on the drain. As illustrated here, the width of M2 may be different at different points along the drain to produce different overlaps with the gate and correspondingly different values of Cgd. Widths 381A-B illustrate that at some points M2 may overlap all, or nearly all, of the gate for a larger values Cgd, and at other points along the length of the drain M2 may not overlap the gate at all for smaller values of Cgd.

The example transistor shown in FIG. 3 may be a high voltage MOS device (HVMOS), an extended drain MOS device (EDMOS), or a laterally diffused MOS device (LD-MOS). High voltage devices sometimes suffer from high electric field gradients, for example, in the Ndrift-PW interface. M2 may form a field plate to reduce stress along the device fingers, for example. In this example, backend metal M2 is patterned on the drain to allow a voltage balance along the finger. Contrary to traditional approaches, which exploit a gate field plate designed to reduce electric field effects, embodiments of the present disclosure tap the drain at the center for reduced path loss and a controllable gate-to-drain capacitance to maintain a constant drain to gate delay over the finger width, for example. Furthermore, a drain field plate is often avoided as it induces charge at the surface reducing the depletion and providing early BV. However, in a thin silicon-on-insulator (SOI) application, the usage of a M2 backend metal, for example, as field plate will not reduce the breakdown voltage because the Ndrift is already fully depleted.

Additionally, patterning the drain metallization M2 over the length of the finger, and partially covering the gate in some embodiments, allows for modulation of the capacitive coupling between drain and gate. In one example embodiment, M2 is decreased from the highest drain voltage point (the center of the finger) toward the edge of the finger (e.g., top and bottom of drain 110 in FIG. 1). This capacitive effect, while potentially reducing gain, may bootstrap the gate voltage where the drain voltage is higher, may normalize the voltage stress across the finger width, for example. Accordingly, embodiments of M2 may be patterned to allow a balanced drain-to-gate delay corresponding to an RC time constant over the length of the drain finger, allowing for the exploitation of very long finger widths in some example applications.

Figure 4:
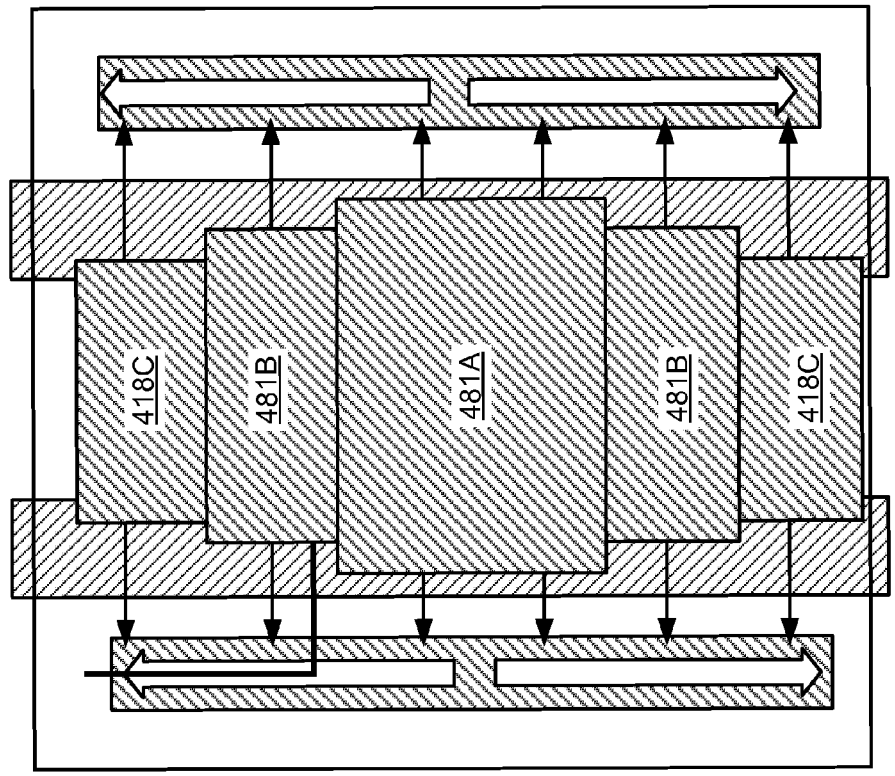
FIG. 4 illustrates tapered compensation according to one embodiment.

FIG. 4 illustrates tapered compensation according to one embodiment. In this example, a BE metal layer M2 is configured such that a taper is wider at a midpoint of the length of the drain and narrows toward endpoints of the length of the drain. In one implementation, the taper comprises stepwise changes in the width of the conductive material along the length of the drain. For example, M2 at 481A may be the widest, where M2 overlaps the gate on both sides of the drain. However, M2 at 481B, adjacent to two sides of M2 at 481A, is narrower and overlaps less of the gate on both sides of the drain than M2 at 481A. Similarly, M2 at 481C may be the narrowest, where M2 may overlap the gate on both sides of the drain the least (or not at all, for example). M2 at 481C, adjacent to two sides of M2 at 481B, is narrower and overlaps less of the gate on both sides of the drain than M2 at 481B. It is to be understood that fewer or more steps in a stepwise taper could be used in other embodiments, for example.

Figure 5:
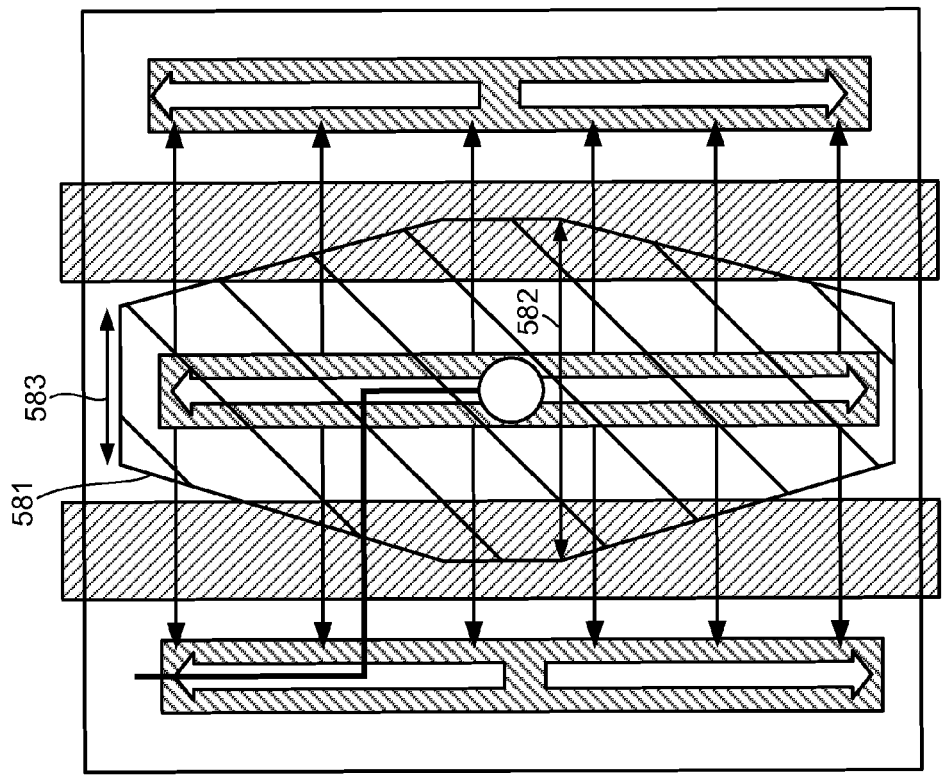
FIG. 5 illustrates tapered compensation according to another embodiment.

FIG. 5 illustrates tapered compensation according to another embodiment. In this example, a BE metal layer M2 581 is configured such that a taper is wider at a midpoint of the length of the drain and narrows toward endpoints of the length of the drain. In one implementation, the taper of M2 581 comprises a linear change in the width of the conductive material along the length of the drain. For example, at the center point of the drain (e.g., Ld/2), M2 may have a maximum width 582. M2 may taper linearly toward each end of the drain toward a minimum width 583. Accordingly, as the resistive path increases, the gate-to-drain capacitance is decreased to compensate for changes in drain voltage and maintain approximately the same RC time constant, for example.

Figure 6:
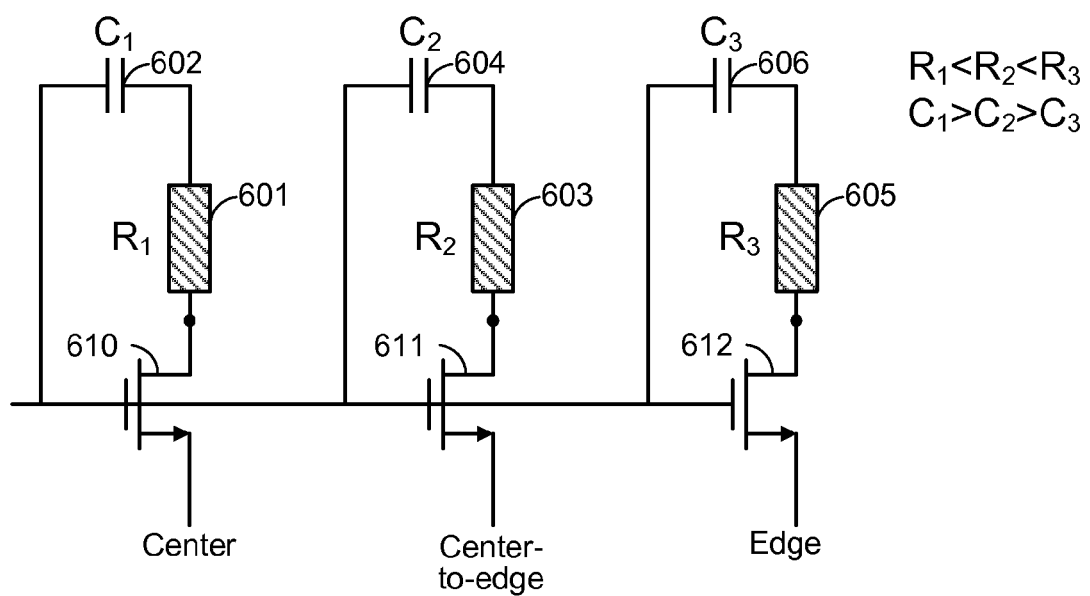
FIG. 6 illustrates a model of parasitic resistance and capacitance in a transistor according to one embodiment.

FIG. 6 illustrates a model of parasitic resistance and capacitance in a transistor according to one embodiment. In this example, a single transistor is modeled as three parallel transistors 610-612. Transistor 610 corresponds to an MOS structure near the center tap, and may have a low drain resistance relative to the other devices due to the short resistive path in the drain. Transistor 611 corresponds to an MOS structure in a region between the center tap and edges, and may have a higher drain resistance than the center device 610, for example, due to the longer resistive path in the drain. Transistor 612 corresponds to an MOS structure in a region at the upper and lower edges, and may have a highest drain resistance, for example, due to the long resistive path in the drain. As illustrated in FIG. 6, tapering may produce different gate-to-drain capacitances, Cgd, along the length of the drain. For example, center transistor 610 may have a first Cgd 602 (C1). The taper is widest at the center so that Cgd 602 has the largest value at the center region. As the resistive path increases along the drain finger, the gate-to-drain capacitance is reduced. For example, center-to-edge transistor 611 may have a second Cgd 604 (C1) that is lower in value than Cgd 602. Similarly, edge transistor 611 may have a third Cgd 606 (C1) that is lower in value than Cgd 604. Accordingly, as the resistive path along the length of the drain increases, the capacitive coupling between the gate and the drain is reduced. Advantageously, a time constant produced by the parasitic resistance and gate-to-drain capacitance may be maintained approximately constant across the drain length. A constant RC gate-to-drain time constant, in turn, improves stability and provides a more uniform delay for long width devices.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A semiconductor device comprising:
a transistor comprising a source, a gate, and a drain;
a conductive material electrically coupled to the drain;
a non-conductive material between the conductive material and the gate of the transistor,
wherein the conductive material is configured to produce a capacitance between the gate and the drain, and wherein the drain comprises different resistive paths to the source, and wherein the conductive material is tapered along a length of the drain parallel to a length of the gate, and in accordance therewith, the capacitance changes inversely with resistance along the resistive paths.

2. The semiconductor device of claim 1 wherein the conductive material overlaps a least a portion of the gate and the drain.

3. The semiconductor device of claim 1 wherein the conductive material is electrically coupled to the drain at a center tap of the drain, and wherein the source comprises a first source finger arranged in parallel with the drain and a second source finger arranged in parallel with the drain configured to produce a current through the center tap of the drain and through the first source finger in opposite directions and through the second source finger in opposite directions.

4. The semiconductor device of claim 1 wherein the taper is wider at a midpoint of the length of the drain and narrows toward endpoints of the length of the drain.

5. The semiconductor device of claim 1 wherein the taper comprises stepwise changes in the width of the conductive material along the length of the drain.

6. The semiconductor device of claim 1 wherein the taper comprises a linear change in the width of the conductive material along the length of the drain.

7. The semiconductor device of claim 1 wherein the drain comprises a length and a width, wherein the source comprises a first source finger arranged in parallel with the length of the drain on a first side of the drain and a second source finger arranged in parallel with the length of the drain on a second side of the drain, and wherein the gate comprises a first gate finger arranged in parallel with the length of the drain between the first side of the drain and the first source finger and a second gate finger arranged in parallel with the length of the drain between the second side of the drain and the second source finger, and wherein the conductive material is arranged vertically above the drain and at least a portion of the gate of the transistor and in electrical contact with the drain at a midpoint of the length of the drain.

8. The semiconductor device of claim 1 wherein the conductive material is configured to produce an approximately uniform RC time constant along the length of the drain.

9. The semiconductor device of claim 1 wherein the transistor is a silicon-on-insulator transistor.

10. The semiconductor device of claim 1 wherein the transistor comprises an Ndrift region between the drain and the source, and wherein the conductive material overlaps the drain and the Ndrift region.

11. The semiconductor device of claim 1 wherein the conductive material is a metallization layer.

12. The semiconductor device of claim 1 wherein the conductive material is electrically coupled to the drain using a first layer metallization at a midpoint of a length of the drain and the conductive material is a second metallization layer coupled to the first metallization layer using a via.

13. A semiconductor device comprising:
a transistor comprising a source, a gate, and a drain,
wherein the drain comprises a length and a width,
wherein the source comprises a first source finger arranged in parallel with the length of the drain on a first side of the drain and a second source finger arranged in parallel with the length of the drain on a second side of the drain, and
wherein the gate comprises a first gate finger arranged in parallel with the length of the drain between the first side of the drain and the first source finger and a second gate finger arranged in parallel with the length of the drain between the second side of the drain and the second source finger; and a conductive material arranged vertically above the drain and at least a portion of the gate of the transistor and in electrical contact with the drain at a midpoint of the length of the drain, wherein the conductive material is configured to produce a capacitance between the gate and the drain, wherein the drain comprises different resistive paths to the source, and wherein the conductive material is tapered along a length of the drain parallel to a length of the gate, and in accordance therewith, the capacitance changes inversely with resistance along the resistive paths.

14. The semiconductor device of claim 13 further comprising a non-conductive material between the conductive material and the gate and the drain of the transistor.

15. The semiconductor device of claim 13 wherein the taper is wider at a midpoint of the length of the drain and narrows toward endpoints of the length of the drain.

16. The semiconductor device of claim 13 wherein the device is configured to produce a current into the midpoint of the drain and through the first source finger in opposite directions and through the second source finger in opposite directions.

17. A method comprising:
coupling a current from a conductive material to a drain of a transistor, the transistor comprising a source, a gate, and said drain;
coupling the current through the drain, under the gate, and to the source along different resistive paths, wherein a non-conductive material is configured between the conductive material and the gate of the transistor, and wherein the conductive material produces a capacitance between the gate and the drain, and wherein the conductive material is tapered along a length of the drain parallel to a length of the gate, and in accordance therewith, the capacitance changes inversely with resistance along the resistive paths.

18. The method of claim 17 wherein the conductive material overlaps a least a portion of the gate and the drain.

19. The method of claim 17 wherein the conductive material is electrically coupled to the drain at a center tap of the drain, and wherein the source comprises a first source finger arranged in parallel with the drain and a second source finger arranged in parallel with the drain, wherein a current flows through the center tap of the drain and through the first source finger in opposite directions and through the second source finger in opposite directions.

20. The method of claim 17 wherein the drain comprises a length and a width, wherein the source comprises a first source finger arranged in parallel with the length of the drain on a first side of the drain and a second source finger arranged in parallel with the length of the drain on a second side of the drain, and wherein the gate comprises a first gate finger arranged in parallel with the length of the drain between the first side of the drain and the first source finger and a second gate finger arranged in parallel with the length of the drain between the second side of the drain and the second source finger, and wherein the conductive material is arranged vertically above the drain and at least a portion of the gate of the transistor and in electrical contact with the drain at a midpoint of the length of the drain.

* * * * *